(12) United States Patent
Mokhlesi et al.

(10) Patent No.: US 7,630,237 B2
(45) Date of Patent: Dec. 8, 2009

(54) SYSTEM AND METHOD FOR PROGRAMMING CELLS IN NON-VOLATILE INTEGRATED MEMORY DEVICES

(75) Inventors: Nima Mokhlesi, Los Gatos, CA (US); Daniel C. Guterman, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/196,547

(22) Filed: Aug. 2, 2005

(65) Prior Publication Data

US 2006/0291285 A1 Dec. 28, 2006

(51) Int. Cl.
G11C 11/34 (2006.01)

(52) U.S. Cl. .............................. 365/185.03; 365/185.24

(58) Field of Classification Search ............ 365/185.03, 365/185.24
See application file for complete search history.

(56) References Cited

U.S. PATENT DOCUMENTS

| | | | |
|---|---|---|---|
| 5,177,706 A | 1/1993 | Shinohara et al. | |
| 5,412,601 A | 5/1995 | Sawada et al. | |
| 5,469,384 A | 11/1995 | Lacey | |
| 5,521,865 A | 5/1996 | Ohuchi et al. | |
| 5,537,350 A | 7/1996 | Larsen et al. | |
| 5,553,020 A | 9/1996 | Keeney et al. | |
| 5,570,315 A | 10/1996 | Tanaka et al. | |
| 5,652,719 A | 7/1997 | Tanaka et al. | |
| 5,867,427 A | 2/1999 | Sato | |
| 5,870,334 A | 2/1999 | Hemink et al. | |
| 5,870,335 A | 2/1999 | Khan et al. | |
| 5,946,236 A * | 8/1999 | Kajitani | 365/185.19 |
| 5,949,714 A | 9/1999 | Hemink et al. | |
| 5,969,985 A | 10/1999 | Tanaka et al. | |
| 6,028,790 A | 2/2000 | Lin et al. | |
| 6,038,174 A | 3/2000 | Khan et al. | |
| 6,044,013 A | 3/2000 | Tanaka et al. | |
| 6,044,019 A * | 3/2000 | Cernea et al. | 365/185.21 |
| 6,097,639 A | 8/2000 | Choi et al. | |

(Continued)

FOREIGN PATENT DOCUMENTS

EP 0 373 830 A2 6/1990

(Continued)

OTHER PUBLICATIONS

Office Action for U.S. Appl. No. 11/029,526 mailed Aug. 8, 2005, 6 pages.

(Continued)

*Primary Examiner*—Michael T Tran
(74) *Attorney, Agent, or Firm*—Davis Wright Tremaine LLP

(57) ABSTRACT

A system and method for quickly and efficiently programming hard-to-program storage elements in non-volatile integrated memory devices is presented. A number of storage elements are simultaneously subjected to a programming process with the current flowing through the storage elements limited to a first level. As a portion of these storage elements reach a prescribed state, they are removed from the set of cells being programmed and the current limit on the elements that continue to be programmed is raised. The current level in these hard-to-program cells can be raised to a second, higher limit or unregulated. According to another aspect, during a program operation the current limit allowed for a cell depends upon the target state to which it is to be programmed.

10 Claims, 7 Drawing Sheets

U.S. PATENT DOCUMENTS

| | | | |
|---|---|---|---|
| 6,134,140 | A | 10/2000 | Tanaka et al. |
| 6,134,141 | A | 10/2000 | Wong |
| 6,181,599 | B1 | 1/2001 | Gongwer |
| 6,208,560 | B1 | 3/2001 | Tanaka et al. |
| 6,219,279 | B1 | 4/2001 | Manolescu et al. |
| 6,222,762 | B1 | 4/2001 | Guterman et al. |
| 6,259,627 | B1 | 7/2001 | Wong |
| 6,266,270 | B1 | 7/2001 | Nobukata |
| 6,282,117 | B1 | 8/2001 | Tanaka et al. |
| 6,285,598 | B1 | 9/2001 | Khan et al. |
| 6,363,010 | B2 | 3/2002 | Tanaka et al. |
| 6,373,746 | B1 | 4/2002 | Takeuchi et al. |
| 6,434,055 | B2 | 8/2002 | Tanaka et al. |
| 6,515,923 | B1 * | 2/2003 | Cleeves ............ 365/201 |
| 6,545,909 | B2 | 4/2003 | Tanaka et al. |
| 6,549,464 | B2 | 4/2003 | Tanaka et al. |
| 6,556,475 | B2 | 4/2003 | Yamazaki et al. |
| 6,798,698 | B2 | 9/2004 | Tanaka et al. |
| 6,845,039 | B2 | 1/2005 | Chen et al. |
| 6,853,584 | B2 | 2/2005 | Nguyen et al. |
| 6,856,551 | B2 | 2/2005 | Mokhlesi et al. |
| 2002/0118574 | A1 | 8/2002 | Gongwer et al. |
| 2005/0013169 | A1 | 1/2005 | Tanaka et al. |
| 2005/0219896 | A1 * | 10/2005 | Chen et al. ......... 365/185.03 |

FOREIGN PATENT DOCUMENTS

| | | |
|---|---|---|
| EP | 0 764 953 | 3/1997 |
| EP | 1 018 747 | 7/2000 |
| EP | 1 246 196 | 10/2002 |
| EP | 1 450 373 A1 | 8/2004 |
| JP | H10-106276 | 4/1998 |
| JP | H10-275480 | 10/1998 |
| JP | H10-275486 | 10/1998 |
| JP | 2001-501013 | 1/2001 |
| WO | 2004053882 A1 | 6/2004 |
| WO | WO 2004/072981 | 8/2004 |
| WO | 2004114316 A2 | 12/2004 |

OTHER PUBLICATIONS

Written Opinion of the International Searching Authority for SanDisk Corporation, International Application No. PCT/US2004/003184 mailed Sep. 7, 2005, 6 pages.

Nobukata et al., "A 144Mb 8-Level NAND Flash Memory with Optimized Pulse Width Programming" *1999 Symposium on VLSI Circuits Digest of Technical Papers*, pp. 39-40.

Johnson et aL., "THPM 12.6: A 6Kb Electrically Erasable Nonvolatile Memory," *International Solid State Circuits Conference*, Feb. 14, 1980, pp. 152-153, 271.

Ohkawa et al., "A 98mm$^2$ 3.3V 64Mb Flash Memory with FN-NOR Type 4-Level Cell," *IEEE International Solid State Circuits Conference*, Session 2, Flash Memory, Paper TP 2.3, 1996, 36-37.

Notification of Transmittal of the International Search Report and the Written Opinion of the International Searching Authority, or the Declaration, in corresponding PCT/US2006/028278, dated Nov. 9, 2006, 10 pages.

Office Action, Chinese Application No. 200480007016.x mailed Apr. 9, 2008, 6 pages.

Office Action, European Application No. 04 708 169.0 mailed Apr. 14, 2008, 2 pages.

Notification of Reasons for Refusal, Japanese Patent Application No. 2006-503314, dated Jul. 28, 2009, 5 pages.

\* cited by examiner

SYSTEM AND METHOD FOR PROGRAMMING CELLS IN NON-VOLATILE INTEGRATED MEMORY DEVICES

TECHNICAL FIELD

The present invention relates generally to non-volatile integrated memory devices and, more particularly, to a system and method for controlling current levels during the programming of non-volatile integrated memory devices.

BACKGROUND

In many non-volatile computer memories, the ability to store data is often related to the amount of current that flows through a particular storage unit during the programming process. One particular example of a non-volatile memory is a Flash or EEPROM memory where the state of a storage unit within the memory is dependent on the amount of charge stored on a floating gate. In general terms, the greater the current that flows through a given unit, the quicker it can be programmed, the wider range of levels to which it can be programmed, or both. However, as a large number of storage units are generally programmed in parallel, with the trend being towards even greater numbers, this results in high current levels, both on average and instantaneously, that are at odds with the trend to lower power devices.

Non-volatile data storage devices, such as electronically erasable programmable read-only memories (EEPROM) or flash memories, are widely used in portable devices lacking a mass data storage devices and a fixed source of power, such as cellular phones, handheld personal computers (PCs), portable music players and digital cameras.

Flash memories are typically semiconductor field effect transistor devices having a number of storage elements each one or more isolated floating gates programmed to store information by injecting charge on the floating gate to change a threshold voltage of the transistor. The injected charge changes the threshold voltage from an intrinsic threshold voltage by an amount proportional to the amount of stored charge. The new threshold voltage of the transistor represents one or more bits of programmed data or information. For example, in a simple memory cell storing a single bit of data, the threshold voltage of the transistor is either raised to a value near a high end of the threshold voltage space or maintained at a value near a low end. These two programmed threshold voltages represent a logical one or a logical zero, and program the memory cell to either turn on or not, respectively, when read conditions are established, thereby enabling a read operation to determine if data stored in the memory cell is a logical one or a logical zero.

Non-volatile memories in general, and Flash EEPROM devices in particular, are discussed more fully in a number of patents and patent applications for various architectures and cell structures. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. Nos. 09/505,555, filed Feb. 17, 2000, and 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patent application Ser. No. 09/893,277, filed Jun. 27, 2001, that is also hereby incorporated by reference, and references contained therein.

EEPROM programming mechanisms include drain side Channel Hot Electron Injection, in which a high voltage on the control gate and another high voltage on the drain cause hot electrons to cross from the drain side of the channel to the floating gate through a thin oxide layer, and Source Side Injection. For Source Side Injection, the presence of a select gate or side-wall can be used to create a select transistor in series with the floating gate transistor. In Source Side Injection a voltage, slightly greater than the threshold voltage of the select transistor is placed on the select gate, a high voltage is capacitively coupled to the floating gate by applying a high voltage to the control gate, and a high voltage is applied to the drain of the floating gate transistor. The voltage on the select gate is sufficient to turn on a portion of the channel under the select gate. The differential voltage between the source and drain generates channel hot electrons at the gap between the select gate and the floating gate which are then swept to the floating gate by a favorable electric field in the gap oxide near the source side of the floating gate.

The latest generation of flash memories can have arrays of hundreds of millions of memory cells which are programmed and erased in sectors or programming blocks ranging in size from 128 to 64K bytes, where the erase and the programming blocks are often not the same size. The programming of large numbers of memory cells is described, for example, in a U.S. patent application entitled "Pipelined Parallel Programming Operation in a Non-Volatile Memory System" by Kevin M. Conley and Yoram Cedar, filed Feb. 22, 2002, that is also hereby incorporated by reference, and references contained therein. Power consumed in programming the large number of memory cells in a sector has become a significant problem in conventional flash memories. It is particularly a problem for portable devices that rely on batteries and generally have an on-chip voltage supply or charge pump with a limited power capacity. Moreover, the trend in many portable devices, such as cellular phones and digital cameras, has been towards smaller devices or form factors. Thus, the increasing number memory cells and the shrinking battery sizes in portable devices have introduced further limitations on the ability to program large numbers memory cells in parallel.

Another concern in flash and other non-volatile memories is performance, particularly the speed of programming in multi-state memories. The dominant multi-level data conditional programming methodology currently in use for fast, high precision programming of non-volatile memories is the controlled bias (e.g. via staircase voltage pulse train) steering (or control) electrode implementation. It has been the approach of choice because it enables spanning the full range of voltage conditions required to program to the corresponding range of target states (as well as accommodate the cell to cell variations in programming characteristics) to effect precise programming in a minimum amount of time. In the majority of hot-electron programming based FLASH and EEPROM cells, this approach is effective because it is able to handle the highly non-linear program rate with applied steering voltage, wherein programming speed increases exponentially with voltage (an essential feature in order to, at the same time, meet the long term retention requirements under the lower voltage read/storage conditions). Furthermore, the use of fixed voltage and varying time is generally considered unattractive-if voltage is too low for the target state, programming becomes unacceptably slow, whereas if too high, programming speed becomes too fast to adequately control the programmed level with the precision required for multi-level storage.

One preferred embodiment of this write data conditional steering methodology is to provide individual steering conditions to each of the group of cells being programmed at a given time, dependent on target state. This requires a cell/array that supports "column-oriented" steering, allowing the data-dependent cell programming condition/stimulus to be applied, not only to the bit line (which primarily acts as a on/off switch to enable or disable any programming in this arrangement), but also to the cells' steering gates, on a cell-by-cell basis. Such an approach is described in U.S. Pat. No. 6,317,363, which is hereby incorporated by reference. This further improves multi-level write performance by allowing optimized conditions for each state to be used, rather than forcing a common set of conditions to all the cells (i.e. independent of individual cell target data), for cells/arrays in which all steering gates in the unit cell block being written are tied together.

The price of this column-oriented steering is the increased overhead (die area and circuit complexity) required to provide the individual steering condition needs to the thousands of cells being simultaneously programmed. Without data-dependent storage element conditions, multi-state programming is slower than binary programming. Additionally, some embodiments of data-dependent programming may not be economical, or may necessitate using larger than optimal erase blocks in order to better amortize the extra area required for circuits that implement the data-dependent programming over a larger erase blocks. Given the increased importance of both operating speed and storage capacity, there is an increasing need for data dependent programming of multi-state non-volatile memories, but preferably without the overhead area and complexity of the added column-oriented steering implementation.

The present invention provides a solution to these and other problems, and offers other advantages over the prior art.

SUMMARY

It is an object of the present invention to provide a system and method for quickly and efficiently programming hard-to-program storage elements in non-volatile integrated memory devices. According to a principle aspect of the present invention, a number of storage elements are simultaneously subjected to a programming process with the current flowing through the storage elements limited to a first level. As a portion of these storage elements reach a prescribed state, they are removed from the set of cells being programmed and the current limit on the elements that continue to be programmed is raised. Although this results in the amount of current flowing per element increasing, since the number elements in which it flows is decreased, the cumulative current flowing can be maintained at a low level while still applying greater current to hard-to-program storage elements.

In an embodiment employing a Flash EEPROM memory, a circuit is provided for quickly and efficiently programming memory cells in a programmable memory device that reduces the instantaneous and average programming current with little or no reduction in programming speed. In general, the method involves applying a set of voltage waveforms to the various gates, and drains of the memory cells that are targeted for programming while limiting drain to source current (IDS) through each of the selected memory cells to a predetermined level by raising the source voltage (source de-biasing) and applying at least one programming pulse to the memory cells. For the cells that need further programming, the IDS limited is raised and further programming pulses are applied.

In one set of embodiments, the present invention is applied in a coarse-to-fine programming technique. In general, the method involves the steps of simultaneously verifying all cells that belong to a programming block against their individual coarse target thresholds and locking out those cells whose thresholds have already exceeded their respective coarse programming thresholds and applying a programming pulse to those cells which have not reached their coarse programming threshold. This process is repeated, but with each repeated programming step increasing the control gate (steering gate) programming voltage pulse by a predetermined coarse increment value. This can continue until all cells in the programming block have been programmed to their respective coarse thresholds, or until the predetermined maximum number of coarse pulses is reached.

In one embodiment, if some predetermined number of coarse pulses have been exhausted and there still remain some cells which have not been programmed to their respective coarse targets, then the source de-biasing condition can be relaxed or lifted at this point, and the program-verify process can be repeated until all cells have reached their coarse targets, or until another predetermined maximum number of allowed coarse pulses have been reached.

At this point, the fine programming phase begins by simultaneously verifying all cells that belong to a programming block against their individual fine programming target thresholds. Those cells whose thresholds have already exceeded their respective fine programming thresholds are locked out and a programming pulse is applied to those cells which have not reached their fine programming thresholds. (The first fine programming pulse applied to each cell's control gate can be smaller by some predetermined amount referred to as the coarse-to-fine-step-back-voltage from the last coarse programming voltage pulse applied to that cell.) The verify-program steps are repeated, but with each repeated programming step increasing the programming pulse by a predetermined fine increment value, until all cells in the programming block have been programmed to their respective fine thresholds, or until the predetermined maximum number of fine pulses is reached. If the maximum number of fine pulses have been exhausted and there still remain some cells which have not been programmed to their respective fine targets, then the source de-biasing condition can again be relaxed or lifted at this point, and the program-verify process repeated until all cells have reached their fine targets, or until another predetermined maximum number of allowed non-de-biased fine pulses have been exceeded.

Preferably, the method includes the further step of turning off memory cells that have been programmed prior to the step of providing a higher IDS to each insufficiently-programmed memory cell.

In one embodiment, the step of limiting IDS is accomplished using a current limiter, and the step of providing a higher IDS to each storage unit in each under-programmed memory cell involves overriding the current limiter. Alternatively, the current limiter is capable of limiting IDS to one of a number of predetermined levels, and the step of providing a higher $I_{DS}$ to each FET in each insufficiently-programmed memory cell includes the step of limiting $I_{DS}$ through each FET in each insufficiently-programmed memory cell to a higher one of the predetermined levels.

In another embodiment, an intelligently determined number of programming pulses up to a predetermined maximum number is applied to each cell in the programming block while the current through the storage unit is limited by the current limiter. Subsequently, a second intelligently determined number of programming pulses up to another predetermined maximum number is applied to each hard to program cell in the programming block to which the higher current needs to be provided. In yet another embodiment, programming pulses are applied to each selected memory cells until a predetermined number of memory cells have been programmed. Thereafter, a number of programming pulses are applied to remaining hard-to-program memory cells to which the higher IDS is provided. Alternatively, programming pulses can be applied to each memory cell to which the higher current is provided until at least a second predetermined number of memory cells have been programmed leaving a last few number of very-hard-to-program cells that are not totally programmed to their final target threshold voltages. Error correction code can be relied upon to correct the errors produced by the possible existence of these last few cells.

The method and circuit of the present invention are particularly useful in a non-volatile memory device having a number of non-volatile storage units. In general, the circuit includes: (i) a voltage supply capable of applying a voltage differential across a pair of terminals in selected storage units; (ii) a current limiter capable of limiting current ($I_{DS}$) through each selected storage units to a predetermined level; (iii) a programming sub-circuit capable of applying programming pulses to the selected storage units; and (iv) a set of peripheral circuits internal to the memory chip capable of controlling the current limiter to allow a higher current level to each hard-to-program storage units after at least a predetermined number of programming pulses have been applied to the selected storage units. In one embodiment, the internal memory chip's peripheral circuits are configured to provide a higher current to each hard-to-program storage unit by overriding the current limiter. Alternatively, the current limiter is capable of limiting current to one of a number of predetermined levels, and the internal memory chip's peripheral circuits are configured to control the current limiter to provide a current at a higher one of the number of predetermined levels to each hard-to-program memory cell after a predetermined number of programming pulse have been applied to the selected memory cells.

In another embodiment, the internal memory chip's peripheral circuits are configured to control the current limiter to provide the higher current to each hard-to-program memory cell after a predetermined number of programming pulses have been applied to the selected memory cells.

In yet another embodiment, the internal memory chip's peripheral circuits are configured to control the current limiter to provide the higher current to each hard-to-program memory cell after a predetermined number of the selected memory cells have been programmed. In a further embodiment, the various aspect of the invention can be applied to a soft programming process, which is other wise known as erase recovery. There may exist defective memory cells that have already been mapped out of the logical sector and are hard to soft program under source debasing conditions. These memory cells may be soft programmed with a grounded source, so as to eliminate parasitic current paths that introduce read errors when a deselected over erased memory cell (that is intended to be off) actually conducts.

In another aspect of the present invention, a current based approach limits the current flowing through selected storage elements during a programming process based upon the elements' target state. According to this aspect, the current limit though a cell during a programming process is a function of the target to which the storage element is to be programmed. Elements being programmed to higher states have their allowed current set to a higher limit allowing their state to change more rapidly. This allows for a convergence of the number of pulses needed to program to any target state while using the same common steering (control) gate programming voltages. In a variation, the system can also set bit-line voltages during programming based on target state.

In one set of embodiments, these aspects can be implemented by use of source side current limiting through the use of constant current sinks connected to the source electrodes, with the value of current being a function of the state that each cell is to be programmed to. A particular implementation is based upon a coarse-fine programming technique, where the fine programming phase limits are the same as the coarse programming phase limits, but off-set by one or two data states. The word "limits" in the previous sentence refers to the voltage applied to the steering (control) gate during the program verify phase: In other words, according to anther aspect of the present invention, the verify voltage for fine verify operation of state N can be the same voltage value as the verify voltage for the coarse verify operation of state (N+1), thereby reducing the number of bus lines required to deliver the various coarse and fine voltages to the sense amp comparators, and also reducing the complexity of decoding them onto individual sense amps.

Additional aspects, features and advantages of the present invention are included in the following description of exemplary embodiments, which description should be read in conjunction with the accompanying drawings.

BRIEF DESCRIPTION OF THE DRAWINGS

These and various other features and advantages of the present invention will be apparent upon reading of the following detailed description in conjunction with the accompanying drawings, where.

DETAILED DESCRIPTION

Figure 1:
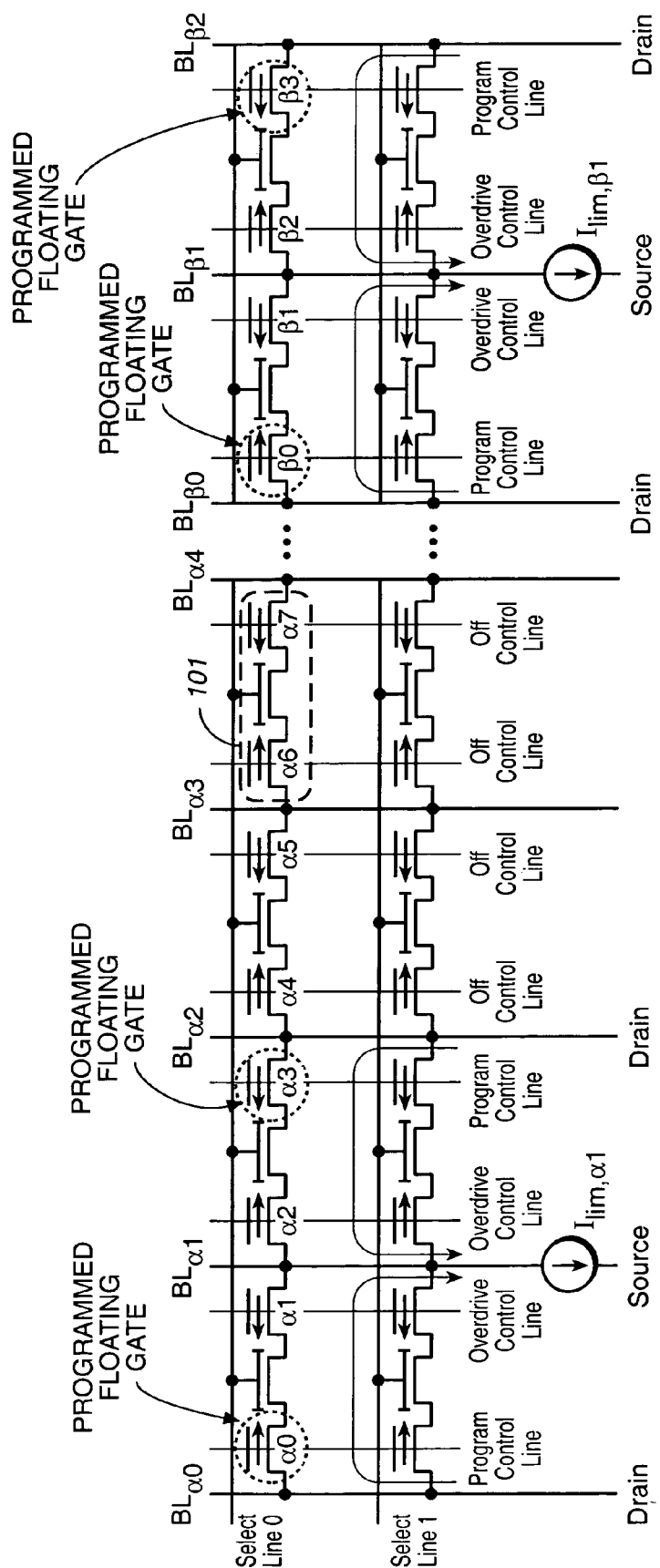
FIG. 1 is an exemplary embodiment of a memory array in which the present invention is employed.

FIG. 1 shows an exemplary embodiment of a portion of a non-volatile memory array 100. In this particular embodiment, each storage unit is a dual floating gate EEPROM unit that is programmed by source side injection. For example, an individual storage unit 101 has floating gate transistors $\alpha_6$ and $\alpha_7$ on either side of a select gate transistor connected between bit lines $BL_{\alpha 3}$ and $BL_{\alpha 4}$ in a virtual ground arrangement. Two rows, connected to Select Lines 0 and 1, and two blocks, the $\alpha$ and $\beta$ areas, of array 100 are shown in FIG. 1, with the actual array generally being much larger. The individual floating gate transistors can each store two or more data states.

The various aspects of the present invention are not particular to the specific type of array shown in FIG. 1, but this structure will often be used as an exemplary embodiment since it can readily illustrate many of the aspects of the present invention. As described in the Background section, current non-volatile memory systems often program extremely large numbers of storage unit in parallel. For example, massively parallel programming is the U.S. patent application entitled "Pipelined Parallel Programming Operation in a Non-Volatile Memory System" by Kevin M. Conley and Yoram Cedar, filed Feb. 22, 2002, which is hereby incorporate by reference, and references contained therein. How quickly and to what level each of these storage units can be programmed, their "programmability", is dependent on the amount of current flowing through the channel of the transistor during the programming process, as is described below. To control the total cumulative current, both on average and at peak levels, a current limiting device can be placed on the source lines of the cell being programmed. This is shown in FIG. 1 where current limiter 103 sets a maximum current level of $I_{\alpha 1,lim}$ for transistor $\alpha_0$, transistor $\alpha_3$, or both, and current limiter 105 sets a maximum current level of $I_{\beta 1,lim}$ for transistor $\beta_0$, transistor $\beta_3$, or both, with the other cells being programmed (and not shown in the figure) being similarly limited.

One way to achieve this is by source de-biasing, which serves to limit the drain to source programming current by raising the source voltage. This will increase the threshold voltage of all transistors (including those storing data) that are in series between the source and the corresponding drain through the body effect and will also reduce the drain to source voltage, thereby reducing the programming current. Previously source de-biasing was envisioned to be either on or off. While an improvement over earlier designs, this approach is not wholly satisfactory.

One disadvantage is that within each sector there typically exists a minority of memory cells that require a higher programming current or longer time to program. The root causes of the existence of such hard-to-program memory cells can be many and include, but are not limited to, the following: 1) cell to cell variations affecting the cell capacitive coupling ratios, 2) the drain/source junction properties, 3) variations in cell oxide thicknesses. 4) asperities in the various material interfaces, 5) microscopic defects/broken bonds in the oxides, the channels, and the junctions of the cell transistors. Thus, in order to provide an acceptably large memory and acceptably short programming time, it is desirable that these cells be programmed at a higher voltage. However, previously source de-biasing was set in the factory and would remain engaged for the life of the chip.

In one embodiment, source de-biasing is achieved by taking the drain to source current out of the source using a constant current sink. An ideal constant current sink (source) instantaneously adapts to a time varying load and applies varying voltages to the source (confined to a limited range) in order to maintain a constant current. In an n-type transistor de-biasing refers to applying a positive voltage to the source. This positive voltage changes even during a single programming pulse. Therefore, in this embodiment, de-biasing is not constant in the sense that the voltage level of de-biasing is dynamically controlled by a constant current source. However, in the same embodiment, the current level of de-biasing is fixed, so in this sense de-biasing can be referred to as being constant.

In the above described source de-biasing method, this option would be set either on or off in the factory and would remain constant with $I_{\alpha 1,lim}=I_{\beta 1,lim}=I_{\gamma 1,lim}= \ldots =I_{lim}$ for the entire chip for the life of the chip. The new innovation consists of dynamically turning off source de-biasing toward the end of each sector's programming by independently varying the various $I_{-,lim}s(I_{\alpha 1,lim}, I_{\beta 1,lim}, \ldots)$ when a few persistent cells remain to be programmed/soft programmed. Since grounded source programming will be resorted to only when a small fraction of cells remain to be programmed, the excess current per cell will not cause excessive chip current consumption because only a few cells will be drawing current. As an example, if grounded source programming results in a 10 fold increase in programming current, then up to 10% of the cells in each programming unit, or "chunk", can simultaneously be programmed with the source grounded, when the other 90% of the cells have been locked out.

Although the present invention is not limited to the array and storage unit structure shown in FIG. 1, this structure is useful as an exemplary embodiment as it contains many features found in other EEPROM and flash systems. FIG. 1 shows a virtual ground array of multi-state storage units each with multiple floating gates; as such, each storage unit bears a number of similarities to a small NAND array, with the storage units themselves arranged in a NOR type architecture. More generally, the memory may employ any of the various NAND or NOR architectures described in the various references incorporated by reference above. By ignoring one of the floating gate transistors in each storage unit (such as $\alpha_6$ in 101), the storage units are reduced to a more traditional floating gate transistor with a select gate. The discussion also readily extends to the case where the select gate is lacking or replaced by side-wall structure, where architectures other than a virtual ground array is used, and where the storage unit is programmed by techniques other than source side injection. The storage unit may also be a NAND string, comprising a number of floating gate transistors connected in series with a select transistor at either end. Even the dual floating gate structure of the exemplary embodiment may have a number of variations, for example erase of the floating gates could be through the channel. As used here, in floating gate embodiments the term "storage unit" will refer to a series of one or more floating gate transistors and possibly one or more select gate transistors. Further details on these different structures are given in the references cited in the Background section. Various issues related to both source side injection and virtual ground arrays are described in U.S. patent application Ser. No. 09/865,320 filed on May 25, 2001, which are hereby incorporated by reference, and references cited therein.

As various aspects of the present invention are related to programming a large number of storage units in parallel where the programmability of the storage units depends on the current flowing through the individual storage units, they are also applicable to parallel programming in other forms of storage units whose programmability depends on current flow. Further, the limiting of current in a read process is described in U.S. patent application Ser. No. 10/254,830, filed Sep. 24, 2002, which is hereby incorporated by reference. Although "storage unit" and "array" can refer to any of these structures in the following, the operation of FIG. 1 will briefly be described in more detail as it will often be referred to.

Figure 2A:
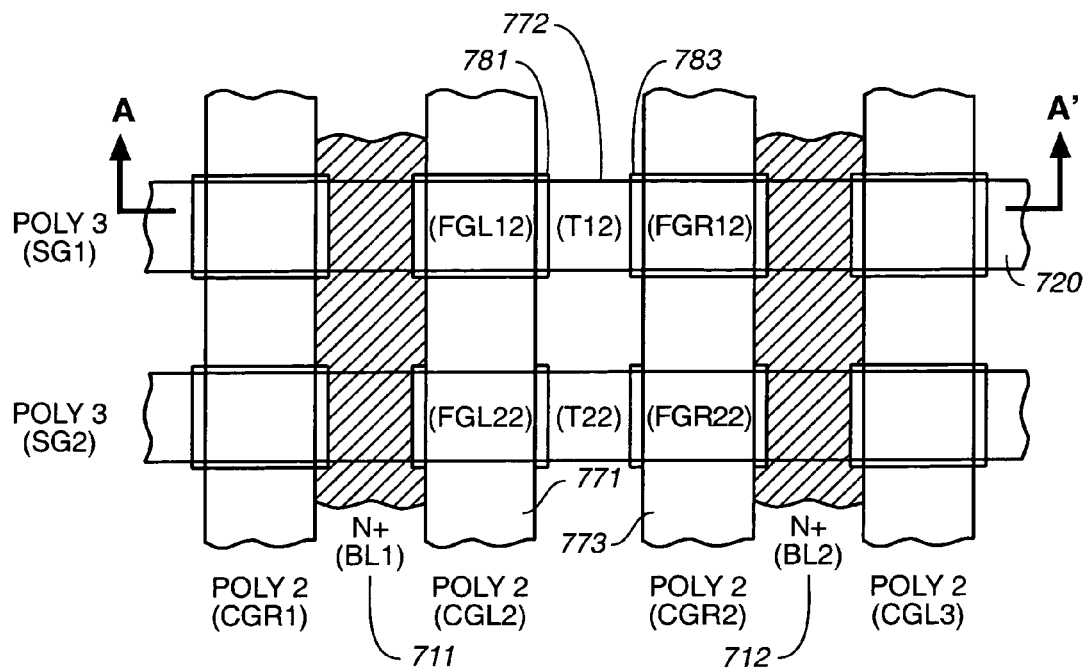
FIGS. 2a, 2b, 3a, and 3b show more detail of the memory array of the embodiment of FIG. 1.
Figure 2B:
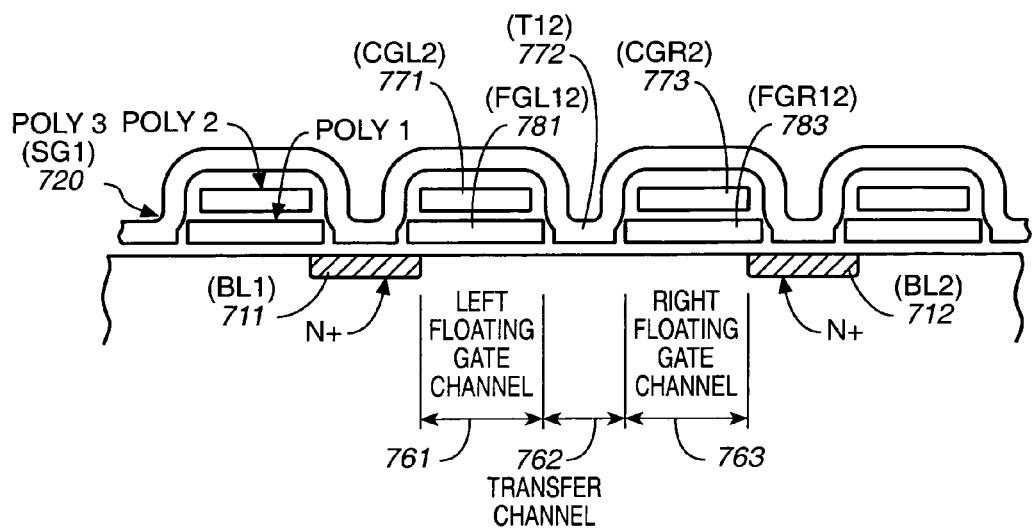

Non-volatile memories with the structure of FIG. 1 are described in U.S. Pat. Nos. 5,712,180 and 6,103,573 and U.S. patent applications Ser. No. 09/505,555, filed on Feb. 17, 2000, and one entitled "Non-Volatile Memory Cell Array Having Discontinuous Drain and Source Diffusions Contacted by Continuous Bit Line Conductors and Methods of Forming" by Jack H. Yuan and Jacob Haskell, filed on Sep. 22, 2000, which are all assigned to SanDisk Corporation and which are all hereby incorporated herein by this reference. These cells can store more than four logical bits per physical floating gate storage transistor. As much of the discussion is based on the array structure and not that of the cells, other embodiments using non-volatile memories without floating gates can also be used. For example, NROM or MNOS cells, such as those described in U.S. Pat. No. 5,768,192 of Eitan and U.S. Pat. No. 4,630,086 of Sato et al. which are both hereby incorporated herein by this reference, could also be used, as could dielectric storage elements such as those described in a U.S. patent application entitled "Multi-State Non-Volatile Integrated Circuit Memory Systems That Employ Dielectric Storage Elements", by Eliyahou Harari, George Samachisa, Jack H. Yuan, and Daniel C. Guterman, filed Oct. 25, 2002, which is hereby incorporated by this reference. FIGS. 2a and 2b show top and cross-sectional views, respectively, of one embodiment of a memory cell structure with multiple floating gates and are adapted from U.S. Pat. No. 5,712,180 that was included by reference above. As shown in the cross-sectional view of FIG. 2b, a channel of the storage unit is formed between the two source/drain regions of bit-lines BL1 711 and BL2 712. The channel is subdivided into three regions: a left floating gate channel 761 under the left floating gate FGL12 781 and left control gate CGL2 771; a right floating gate channel 763 under the right floating gate FGR12 783 and right control gate CGR2 773; and, between these, a select channel 762 underneath the select transistor T12 772.

As shown in FIG. 2a, in this structure the word-lines, such as SG1 720, cross the bit-lines, such as BL1 711 and BL2 712, to form the array. The memory cell locations within the array are then defined by the intersection of these lines; for example, the cell of FIG. 2b with select transistor T12 772 lies along word-lines SG1 720 between BL1 711 and BL2 712. The control gates are connected along the columns parallel to the bit-lines instead of along the rows as in more common architectures. Thus, by applying a voltage to the control gate line CGL2 771, this voltage is applied not just to the gate of the cell containing transistor T12 772, but also the left control gates of all of the cells in the column between bit-lines BL1 711 and BL2 712.

Figure 3A:
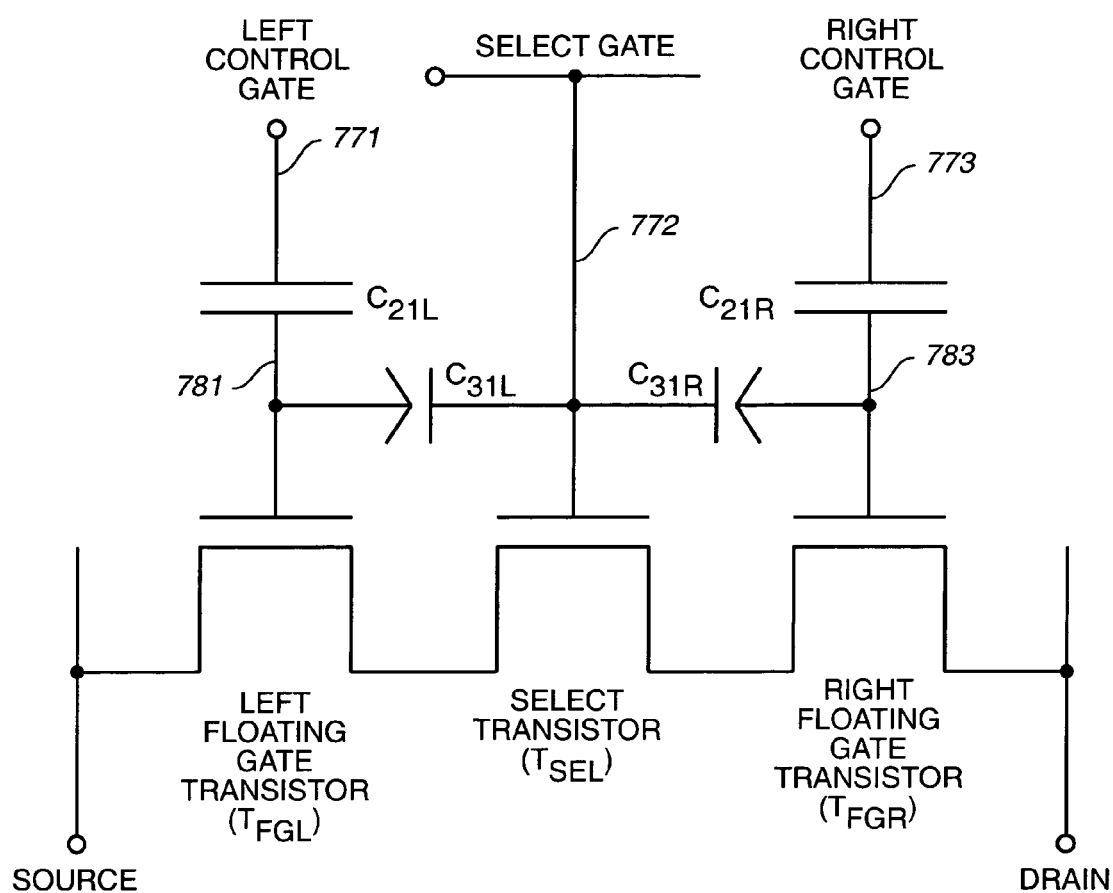
Figure 3B:
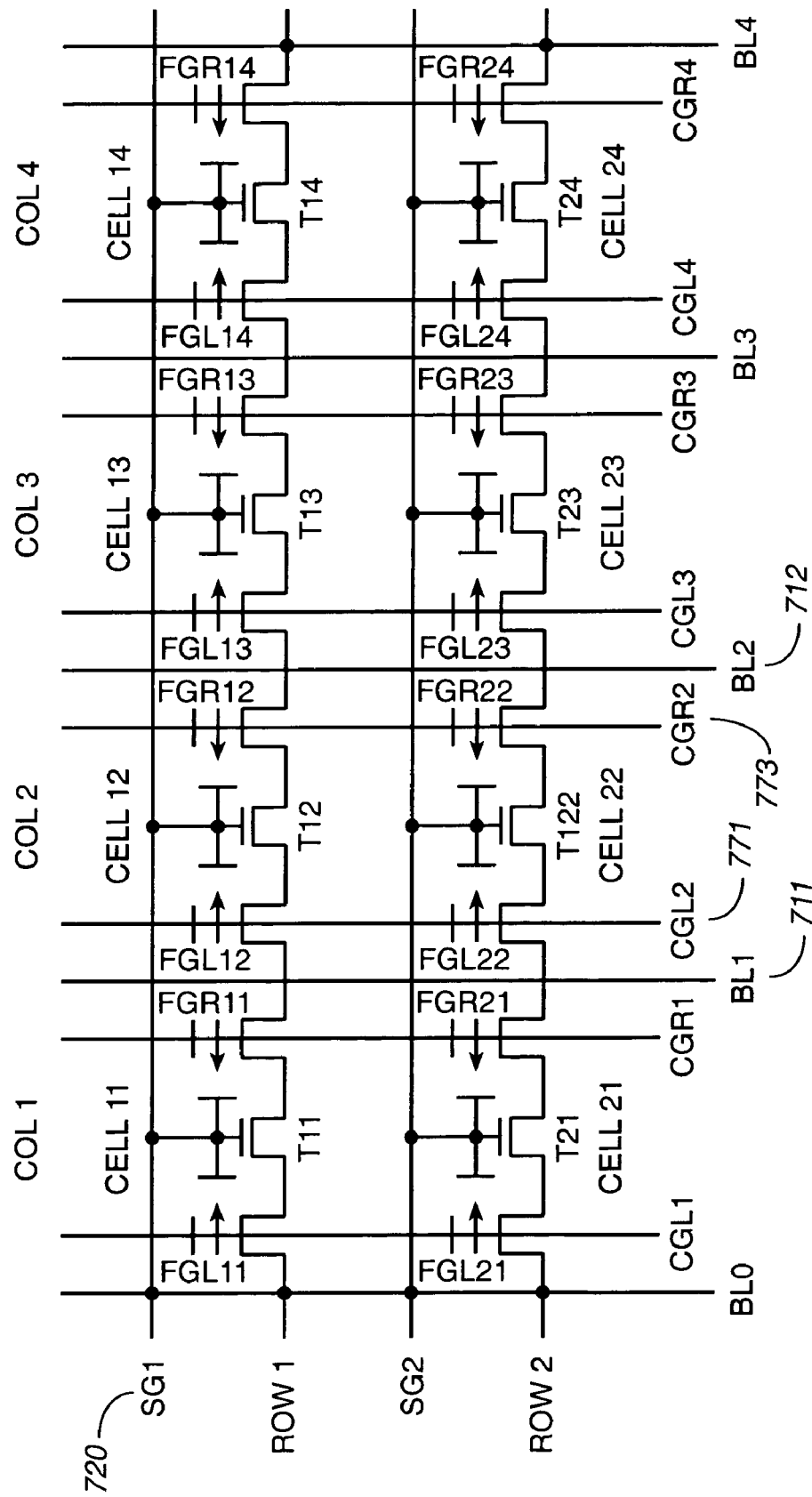

FIG. 3b is a circuit diagram depicting one embodiment of an array of memory cells such as those of FIGS. 2a and 2b, where FIG. 3a is an equivalent circuit of these memory cells. The floating gates 781 and 783 of the cell can be programmed and read independently. For example, to program the right floating gate 783 in FIG. 3a, an overdrive voltage of, for example, 8 volts is applied to the left control gate 771. The actual value is not critical, but is taken to be enough to fully turn the left floating gate transistor $T_{FGL}$ on regardless of the data state stored on its floating gate. With the left floating gate transistor $T_{FGL}$ effectively removed from the circuit, the right floating gate transistor $T_{FGR}$ can be programmed much as the transistor of a single floating gate is programmed through the source-side injection method.

In a regular programming operation, the drain is again set at around 5 volts, or more generally 4-7 volts, and the source is set at ground and/or connected to ground through a current limiting device. All of the cells in the column will be in the same condition. For the selected rows, a voltage of 1.5-5 volts is placed on the select gate, thereby turning on the select transistor. This induces a current through the channel, with the electrons entering at the source-side. In non-selected rows, the select gate line, or word-line, is held at ground and these select transistors are held turned off. The programming voltage of, say, 5-10 volts is then applied to the right control gate. These values induce a high electric field in the channel region between the select transistor and the right floating gate transistor. The result is that electrons entering from the source are injected into the (right) floating gate in response to the programming voltage. To program the left floating gate, the roles of the left and right control gates are reversed, as are the source and drain.

As shown in FIG. 1, the array can be biased so that adjoining storage units can be programmed simultaneously. For example, floating gate transistors $\alpha_0$ and $\alpha_3$ both use bit line $BL_{\alpha 1}$ as a source line during programming. This allows these two transistors to either be programmed together or separately in different implementations, based on how the various lines are biased and according to speed and accuracy requirements.

The floating gate transistor can be erased by applying the erase voltage to the select gate, so that both the left and the right floating gates are erased through their respective couplings of $C_{31L}$ and $C_{31R}$, or through other methods, such as channel erase. More details on erase and other operations are given in U.S. Pat. No. 5,712,180, which was incorporated by reference above. As described there, in a sensing process for either a read or verify operation, the transistors in the storage unit not being sensed are turned fully on and the transistor whose state is being sensed can be treated by the various techniques known in the art. Channel erase is described more in previously incorporated U.S. patent application Ser. No. 09/893,277, although in the context of a NAND architecture. A number of sensing techniques are described in a U.S. patent application entitled "Noise Reduction Technique for Transistors and Small Devices Utilizing an Episodic Agitation" by Nima Mokhlesi, Daniel C. Guterman, and Geoff Gongwer filed on Jan. 18, 2002. A verify process differs from a data read process in that a verify process compares a parameter indicative of the state of the cell against a target value instead of determining which of the possible data states the cell belongs through, for example, a binary search.

Application to Hard to Program Cells

Returning to the present invention, its various aspects include: 1) the massive parallel write of plurality of storage units; 2) current limiting during write for each storage unit to manage peak and average cumulative power at the possible cost of somewhat lower speed or programmability per storage unit; 3) lock out each storage unit terminating programming and storage unit current draw as each storage unit achieves its target state; 4) once the number of such storage units still programming have gone below a predetermined limit and/or the number of programming pulses has been exceeded, decrease the magnitude of the current limiting (that is, increase storage unit current) to increase programming speed/programmability. These concepts may be applied progressively as the number of storage units drops below progress target values.

In order to limit the instantaneous and the average programming current per storage unit, a constant current sink serves to limit the programming current. In the example of FIGS. 1-3, this would limit the drain to source programming current by effectively raising the source voltage. This positive source voltage will reduce the drain to source potential difference, $V_{DS}$, and increase the threshold voltage of all 3 transistors (2 floating gate, 1 select) that are in series between the source and drain of each storage unit through the body effect, thereby reducing the programming current. In doing so, it also limits the maximum achievable control or steering gate threshold voltage of the storage units. Within each programming unit (for example, a sector or programming block) there may exist a minority of cells that are harder to program. In order to have a large memory threshold window, these cells can be programmed to higher threshold voltages.

Figure 4A:
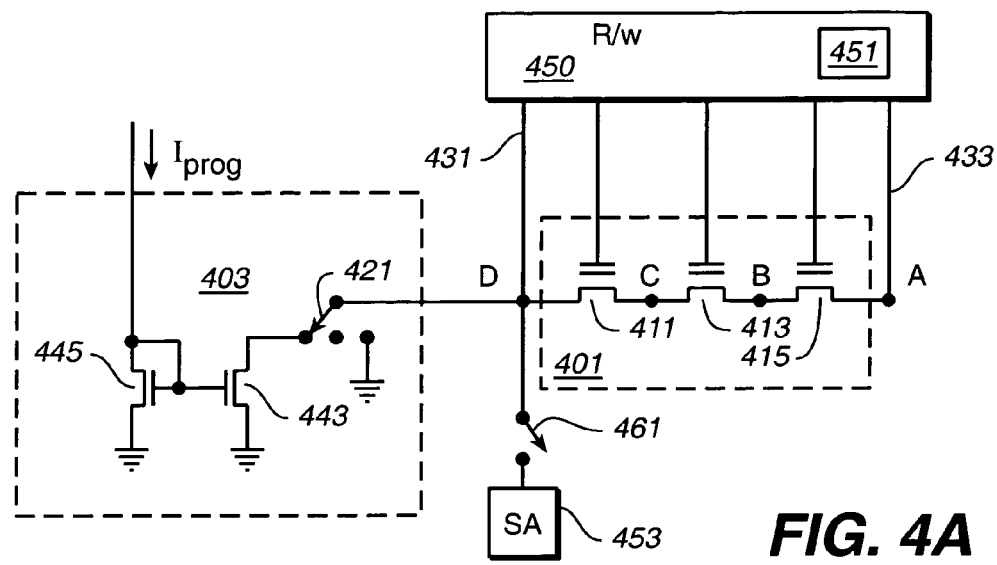
FIGS. 4a and 4b show a detail of a storage unit and current limiter of FIG. 1.

In one embodiment, dynamically lifting the constant current condition for the last few pulses applied to the last few storage units which have not yet locked out of programming after a certain number of maximum control gate programming pulses have already been applied to them may enable these hard to program storage units to program to the required higher threshold voltages. If source de-biasing is relied upon to suppers the program disturb condition, then the frequency of programming with grounded sources can be limited in order to minimize the disturb mechanism. An event counter may be devoted to monitoring the frequency of grounded source programming events. FIG. 4a shows a first exemplary embodiment of a storage unit 401 and current limiter 403 according to the embodiment of FIG. 1. In this example, a storage unit 401 is connected between bit lines 433 and 431 at nodes A and D, respectively, and is composed of floating gate transistors 411 and 415 respectively connected though nodes B and C to the interposed select transistor 413. As previously described, the storage unit 401 may alternately consist of other floating gate storage unit types, such a NAND string, or, more generally, units based on non-floating gate technologies. The exemplary storage element 401 will be used to present aspects of the invention, with the corresponding operation of these various alternatives are described in more detail in the corresponding references given above.

As drawn in FIG. 4a, the floating gate to be programmed or read is transistor 415, with the position of switches 421 and 461 shown for normal programming. When reading or verifying transistor 415, node A is the source for read which is grounded, node D is the drain for read which is driven by the sense amp, and the current limiter 403 is disconnected from node D, which means that in read/verify mode the switch 421 is in a floating position. A single pole/triple throw switch 421 is drawn in box 403. During normal programming switch 421 connects node D to the drain of transistor 443 (the position shown in FIG. 4a), during the last few programming pulses when the current limiting condition is to be lifted node D is connected to ground (the right position), and during read/verify node D is connected to a floating leg of switch 421 (represented by the center position), in effect disconnecting the current sink from Node D. A single pole/single throw switch 461, connected between the sense amp and node D, is closed during read, and is open during programming. So, during programming node D is the source for programming, the sense amp is disconnected from node D, and the current sink 403 is connected to node D.

In a typical programming process of memory cell 415 by source side injection into the floating gate of transistor 415, node A is placed at a high voltage by raising the level on bit line 433. Transistors 411 and 415 are turned on using the voltages described above on their respective control gates. Transistor 413 is turned on by applying a high enough word line (i.e. select gate) voltage to turn this select transistor on at a level that exceeds its threshold voltage by half a volt to a few volts. During programming, node D (i.e. the source for programming) is normally connected to current limiter 403, but node D is grounded when the current limiter is to be bypassed. The voltage across the whole storage unit is then $V_A$-$V_D$ and voltage across the channel of the transistor to be programmed, 415, is somewhat less at $V_A$-$V_B$ due to the drop across transistors 411 and 413. When the switch 421 connects node D to ground, the full voltage $V_A$ will be placed across the storage unit 401 (where the other voltage drops and transients found in a real circuit that will keep $V_D$ from ground are being ignored for this discussion). To program transistor 415, its control gate is pulsed with the programming voltage causing a current $I_{DS}$ to flow through its channel and charge to be stored in its floating gate. When node D is connected through switch 421 to ground, $I_{DS}$ is largely unregulated.

As described above, to control the amount current flowing in the circuit, the current limiter 403 is used. When node D is connected by switch 421 to ground through transistor 413, $I_{DS}$ is limited to be no greater than a value $I_{prog}$. When the current flow is limited, the voltage on node D is raised and the body effect will limit current flow in all three transistors, by bottle necking the current passing through the select gate 413. The two floating gate transistors 411 and 415 will be biased well above their respective thresholds during programming to present a bottle neck for current. The current limiting action of the constant current sink 403 is achieved by primarily raising the threshold voltage of the select gate transistor through the body effect. Weather current limiting is engaged or not, the select transistor is the one transistor that limits the current from node A to node D.

In the exemplary embodiment, a current mirror of NMOS transistors 443 and 445 is used. The dispositions of switches 421 and 461 are controlled by Block R/W 451. In actual implementation, switch 421 can be composed of 2 transistors: one transistor between node D and ground the gate of which is controlled by 450, and another transistor between node D and drain of 443 whose gate is also controlled by 450. Switch 461 is also a transistor between node D and the sense amp, the gate of which is also controlled by 450. When a switch is placed between 2 nodes it is the interchangeable source and drain that are connected to the two nodes. In order for contentions not to occur, the timing of turning on these transistors has to be such that one is turned off before another is turned on. Depending upon the disposition of the switch 421, the current through storage unit 401 is limited to be no greater than $I_{prog}$ or not limited. More generally, there can be several limits, $I_{prog,1} \leq I_{prog,2} \leq \ldots \leq I_{prog,n}$, available with either a connection ground or $I_{prog,n}$ representing the highest allowed flow. This allows the current flow in the storage unit to be any on of these n or n+1 values.

Storage unit 401 can correspond to any of the storage units in FIG. 1, for example that containing $\alpha_2$ and $\alpha_3$, in which case bit lines 431 and 433 would respectively correspond to $BL_{\alpha 1}$ and $BL_{\alpha 2}$ and current limit 403 would correspond to current limiter $I_{\alpha 1, lim}$ 103. Each bit line of the array is connectable to such a current limiter when it serves as a source for programming. The read, write, and corresponding control circuits and their connection to the current limiters is not shown in FIG. 1.

The current limiters, such as 403, may each have many legs allowing their use for multiple bit lines at the same time. Each of these may be controlled independently allowing the maximum level in each source line to be independently controlled. As noted, a large number, perhaps thousands, of storage units are programmed in parallel. This process as seen by the individual storage unit will be described with respect to FIG. 4. Normally the current mirror has a single input transistor 445 and thousands of output transistors such as 443 where each of a large number of cells that are simultaneously programmed has one output transistor. In this manner the input current of, for example, 1 µA is amortized over thousands of cells. But if each cell has its own input and output transistors, then not only does the die size increase, but also the current consumption is increased because of the cumulative effect of the 1 µA that the input transistors of the separate mirrors.

Returning to FIG. 4a, at the start of a programming process, the storage unit is biased for programming and the current level limited to $I_{prog}$ (or $I_{prog,1}$ if more than one limit is used) by limiter 403. The control gate of transistor 415 is then pulsed to store more charge leveling the floating gate of transistor 415, interspersed with sensing operations using sense amp 453 to compare the state of the storage unit against a target value. If the storage unit verifies against the target, then the storage unit can be locked out of further programming, by, for example, substantially raising the voltage level on node D. If the storage unit does not verify, the process continues. As storage units verify and are locked out, the number of storage units being programmed and the corresponding consumed programming current decreases. As the number cells still being programmed falls below a certain number, either in terms of absolute number or proportion, or after a certain number of pulses (as determined by event counter 451), or a combination of these two, the current limit on these remaining, hard to program cells can be raised. The switch 421 in the corresponding current limiters 403 can connect node D to ground. The process then continues until the programming is complete or until a storage unit is found to be unprogrammable and defective, in which case it is mapped out. If multiple limits are used, this dynamic raising of the current limits can progressively proceed through $I_{prog,1}, I_{prog,2}, \ldots, I_{prog,n}$.

Figure 4B:
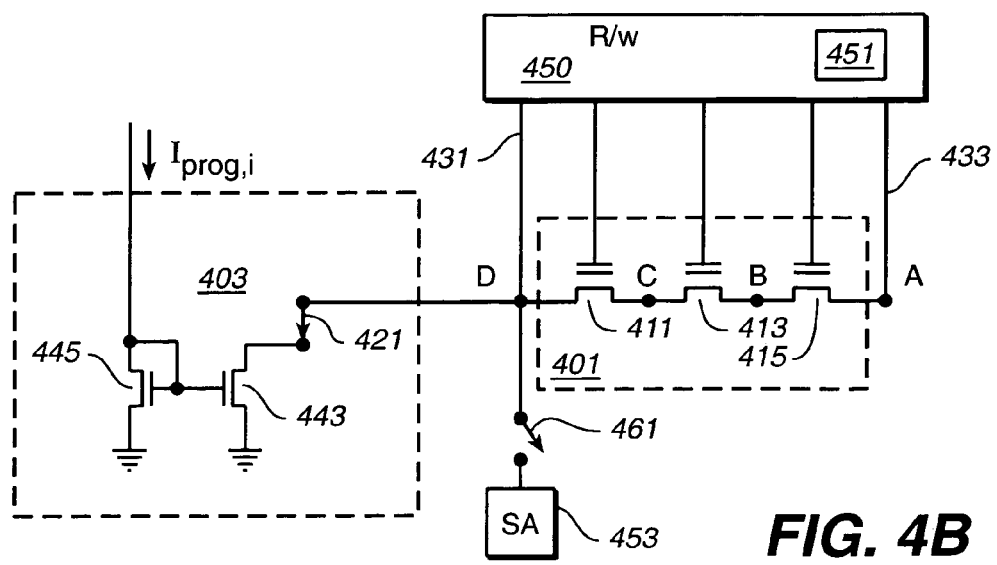

FIG. 4b shows another embodiment that is a variation on that of FIG. 4a. In this case, the several current values $I_{prog,i}$, where i=1, ..., n with n≧2 and $I_{prog,1} \leq I_{prog,2} \leq \ldots \leq I_{prog,n}$, are available to the limiting circuit 403. Node D is always connected to drain of transistor 443 during programming, and the switch 421 need only be a single pole/single throw switch. The transition from normal programming with constant current sinking to a grounded node D can be made a more gradual one by incrementally increasing the mirror input current labeled $I_{prog,i}$, which is fed to the drain node of transistor 445. For example $I_{prog,1}$ could be set to 1 μA for as long as the control gate voltage is being stair cased from pulse to pulse. But when the programming control gate voltage reaches its maximum value of, for example 12V, and if there still remain a few cells that have not been sufficiently programmed, then the subsequent programming pulse can be at the same maximum control gate voltage, but the current limiting can be relaxed from $I_{prog,1}$=1 μA per cell to $I_{prog,2}$=2 μA per cell and with the next pulse can be applied with a current sink value of, for example, $I_{prog,3}$=4 μA per cell. This provides a more gradual transition than completely lifting the current limiting all at once. An advantage of the gradual method is a smaller likelihood of over programming upon the first application of a non-current limited programming pulse. The gradual transition method of FIG. 4b is more easily implemented in an architecture using commonly driven control gates (as opposed to an independently driven control gate architecture) because all the cells that are simultaneously being programmed reach the maximum control gate condition at the same time, which is not the case for the independently driven control gate architecture.

In FIGS. 4a and 4b, switches 421 and 461 can be controlled by the controller or by internal peripheral circuits on the memory chip, such as those represented schematically by blocks 451 and 453. For high-speed operations, it is usually preferable that the controller should never become aware of the existence of hard to program cells, let alone try to program them. In this way, the controller just needs to shift in data that is to be programmed, the address that the data should go to, and a command to the memory chip to start programming, with all subsequent activities transparent to the controller. The memory chip's internal peripheral circuits are on their own until the programming is done and when the programming is finished the memory chip communicates to the controller that programming is finished by changing the state of the Ready/Busy signal.

Figure 5:
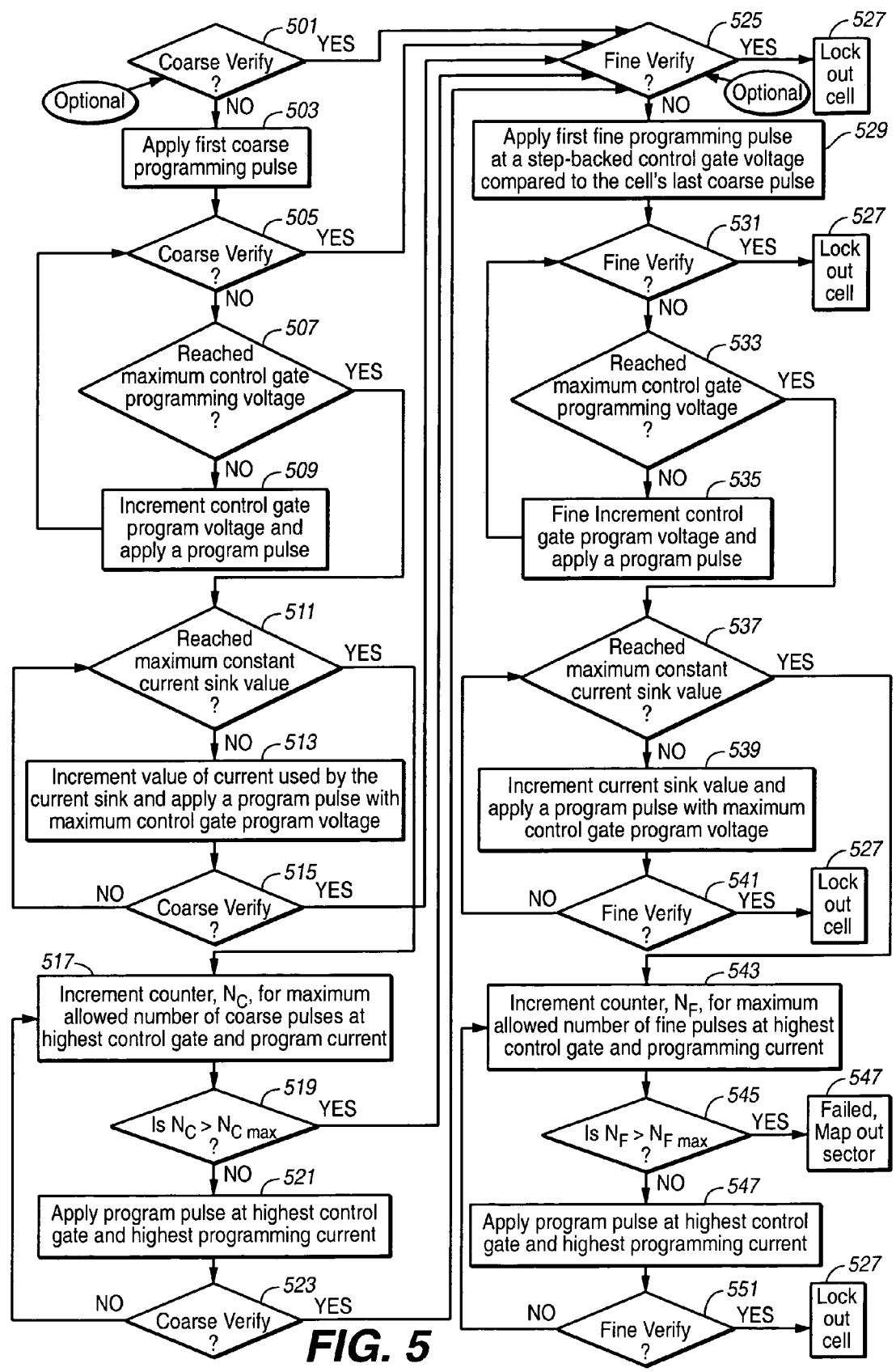
FIG. 5 is a flowchart of the operation of one embodiment of the present invention.

FIG. 5 is a flow chart for an exemplary embodiment of the present invention, in this case using a coarse-fine programming technique on a memory with storage elements of the type shown in FIGS. 1-4. The use of a programming technique having a coarse mode and a fine mode is described in U.S. patent application Ser. No. 09/793,370 filed Feb. 26, 2001, which is hereby incorporated by reference.

The process begins at optional step 501 with verifying in parallel all cells that belong to a programming block against their individual coarse target thresholds. In the commonly driven steering architecture this verify and subsequent verifies will have to be broken down to a sequence of sub-verifies, each of which is verifying a group of cells against their the same target state. When all the steering gates of group of cells that belong to the same programming block are tied to one another, there is no way to apply, for example, 1 volt to some of them that are targeted to be programmed to state 2 while at the same time 2 volts is being applied to some others that are being programmed to state 4. So after each programming pulse, all or at least a subset of the sub-verifies have to be performed. In a 8 state per cell design, each programming pulse will have to be followed by 7 verify operations, the first of which discriminates between states 0 and 1, the second of which discriminates between states 1 and 2, ..., and the seventh of which discriminates between states 6 and 7. Suitable program verification techniques are described further in U.S. patent application Ser. No. 10/314,055, filed Dec. 5, 2002, which is hereby incorporated by reference. A parameter value indicative of the state of the cell, typically a current or voltage, is compared against its target value, such as is described in the U.S. patent application entitled "Noise Reduction Technique for Transistors and Small Devices Utilizing an Episodic Agitation" incorporated by reference above. If the block has been previously programmed, this will have been preceded by an erase process and, depending on the embodiment, the erase process is followed by a soft programming process as described further below. If the storage units verify to their coarse reference value, the process switches to the fine mode of step 525; if not, the process goes to step 503.

The storage units needing programming are biased, for example by placing a voltage across the source and drain of a floating gate transistor cell, the current is limited to a first level, and the programming, such as pulsing the control gate of a floating gate cell, occurs in step 505. This is followed by another coarse verify (505), again going to step 525 if the target criteria are met. If the cell does not verify, the programming voltage at the control gate is increased and another pulse is applied (509), followed by a return to the verify step 505. Between steps 505 and 509, step 507 checks whether maximum control gate programming voltage is reached. The loop of steps 505, 507, and 509 continues until either verified, in which case the process goes to step 525, or the maximum control gate programming voltage is reached, in which case it goes to step 511.

Steps 511, 513, and 515 form a loop where the current limit is raised while the control gate program voltage is kept at its maximum value. In alternate embodiments, the voltage could be backed down and raised back to its maximum in steps, as in the loop of steps 505-509, more than one pulse at a given current limit/maximum voltage combination could be used, or a combination of these. In steps 511, the value of the current sink is first checked, followed by being incremented in step 513 if a higher value is available, and another coarse verify in step 515. If the maximum current sink value is reached in step 511, the process goes to step 517.

Steps 517, 519, 521, and 523 allow for the storage element to be pulsed a number of times ($N_{Cmax}$) at the maximum control gate programming voltage and highest programming current. In step 517, the number of such pulses, $N_C$, is incremented, followed by a check (519) on whether it has exceeded its maximum value $N_{Cmax}$ and the application of a pulse if not (521). If the cell verifies or the maximum number of pulses at these conditions is reached, the process goes to step 525.

Step 525 is an initial verify at the fine target parameter value and is optional. If the cell does not verify, the control gate voltage is stepped back and the fine programming process begins at step 529. Steps 531-551 are the same as the corresponding steps in the coarse programming phase. However, if a cell verifies at any of the fine verify steps (steps 525, 531, 541, and 551), it is now locked out in step 527. Also, if the maximum number of pulses ($N_F$) at the maximum control gate programming voltage and highest programming current exceeds the limit ($N_{Fmax}$) in step 545, programming has failed and the corresponding cell or the entire sector that the cell belongs to is mapped out in step 547.

Various aspects of the present invention can be applied to soft programming, which is otherwise known as erase recovery. By definition, FLASH-cell erasure requires the erase of at least an entire sector, which is usually a word-line, of cells. Due to differences in erase rates of the various cells on this common word-line, cells may often erase beyond the minimum lower threshold voltage needed to reliably indicate an erased state. Soft programming is a technique used to gently raise the thresholds of over-erased cells prior to the actual data programming. More details on some of these techniques can be found in U.S. Pat. Nos. 5,172,338 and 5,272,669, both of which are assigned to SanDisk Corporation and both of which are hereby incorporated herein by this reference. Aspects of soft programming particularly applicable to the exemplary embodiment of FIGS. 1-4 are presented in U.S. patent application Ser. No. 09/865,320 filed on May 25, 2001, which is incorporated herein by reference above.

In a memory array there may exist defective cells that have already been mapped out of the logical sector and are hard to soft program under source debiasing conditions with the current limiting engaged. If such cells exist in the array in an over-erased state, they will not be programmed with data. As they are over-erased, they can result in a parasitic current path. If these cells are hard to program, a standard soft programming operation with the current limited at its lowest level may not be sufficient to take them out of their over-erased condition. To raise the threshold sufficiently on these cells, the present invention can be applied to the soft programming process. These memory cells may be soft programmed with a grounded source, so as to eliminate parasitic current paths that introduce read errors when a deselected over erased memory cell (that is intended to be off) actually conducts. As with the other implementations of the present invention, one or more intermediate current limit(s) between the first limit and a grounded source can be used.

Programming Current Level Dependent on Target State

The preceding aspect of the present invention set multiple limits on the current flowing through a storage element during programming based on whether the element was difficult to program. The use of multiple current limits during programming can be used in other ways also. One example of the use of different limits is as part of a coarse-fine programming method, as is described in U.S. patent application Ser. Nos. 10/766,217, 10/766,786, and 10/766,116 all filed on Jan. 27, 2004 and hereby incorporated by reference, where the limit is based upon whether a cell is in the coarse or fine programming mode. Another example of using different current limits during programming is making the limit a function of the target state of the cell, an aspect of the present invention presented in the following.

In view of the problems described with the prior art in the latter portion of the Background section, the present invention introduces considering instead to use the bit line, which is the already existing column oriented, data dependent cell control line, for the "steering" role as well, thereby eliminating the overhead area and complexity of the added column-oriented steering implementation. The present invention extends the bit line's historical role beyond the on/off enabler of data programming, and provides means for it to achieve precise programming level control as well. The challenge is to develop such means, since with hot electron programming or other techniques, control via bit line voltage tends to be extremely non-linear. The consequence-programming speed grows very quickly over a very small increase in bit line voltage-makes voltage control of high precision multi-level programming (requiring control of programming rate over a much larger range of voltage conditions) unattractive.

The principles of the present invention have application to various types of non-volatile memories, those currently existing and those contemplated to use new technologies that are being developed. Implementations of the present invention, however, are described with respect to a flash electrically-erasable and programmable read-only memory (EEPROM), wherein the storage elements are floating gates. The previous section was described using a dual floating gate cell as the basic storage element. The following discussion will be illustrated for a single floating gate cell, although this may be part of a NOR array or a single floating gate transistor out of a NAND string or dual floating gate element such as 401 in the preceding discursion.

Figure 6:
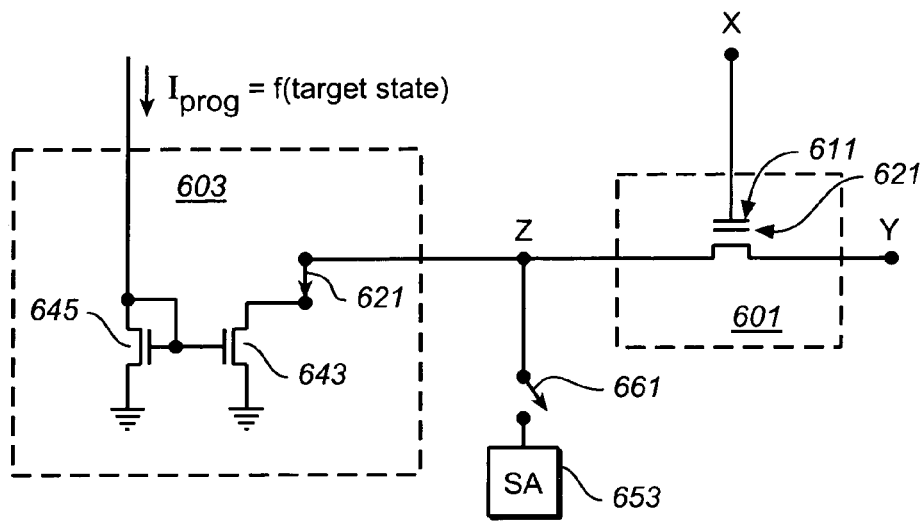
FIG. 6 is a schematic representation of using a programming current limit based on target state of the storage element.

FIG. 6 shows a non-volatile memory storage element 601 with three terminals X, Y, and Z, in this case a single transistor floating gate EEPROM cell. The terminal X is connected to control gate 611 above floating gate 621 and terminals Y and Z are connected to the source/drain regions. More generally, in the EEPROM or Flash memory case, the storage element consists of one or more floating gate transistors and maybe a number of select gates connected in series, which may lead to a number of additional terminals for various control gates. Examples of such Flash cell variations spanning different array types and other types of storage elements are described after some of the exemplary embodiments.

A standard method of programming a floating gate memory cell 601 is to place a voltage differential across terminals Y and Z and pulse the control gate 621 at terminal X, resulting in some of the charge flowing through the channel being transferred to the floating gate. As described in the Background section, typically a stair stepped voltage pulse is applied to the control gate, alternating with verification steps, which is then stopped when the cell verifies at, or above its target state threshold value. Aside from some examples using binary memory cells, where an erased cell is either programmed or not, the voltage difference and current flow between terminals Y and Z in a programming process is not data dependent. Terminal X, Y, or both are generally connected along the bit lines of an array of non-volatile cells. The present invention is primarily concerned with the case where the storage elements stores more than two data states. According to a principle aspect of the present invention, a bit line governed data dependent programming technique is used for multi-state storage units, such as cell 601 of FIG. 6. A bit line data dependent programming technique can be based on a voltage based implementation, such as that described in U.S. Pat. Nos. 6,266,270 and 5,521,865 and the papers "A 144Mb 8-Level NAND Flash Memory with Optimized Pulse Width Programming", Hiromi Nobukata et al., published in 1999 *Symposium on VLSI Circuits Digest of Technical Papers*, pp. 39-40, and "A 98 mm² 3.3V 64 Mb Flash Memory with FN-NOR Type 4-level Cell", by Masayoshi Ohkawa et al., published in 1996 *IEEE International Solid-State Circuits Conference*, pp. 36-37, all of which are hereby incorporated by reference. The following discussion presents a current based approach, although this can be combined with the voltage based implementation, as these are complimentary.

The aspect of setting a programming current level dependent on target state is in many respects the converse of, and complementary to, that described in U.S. patent application Ser. No. 10/600,988, which is hereby incorporated by reference. In that method, during programming the current through a storage element is held to a fixed value, while the voltage placed between the source and drain is dependent on the target state.

The objective of the current based programming scheme is again to reduce the number of stair-cased programming pulses from a value that covers the span of the natural distribution of programming characteristics plus the cell threshold operating window to a value that covers the natural distribution only. As before, these programming techniques can be combined with various coarse/fine programming schemes, such as those described in U.S. patent application Ser. Nos. 09/793,370, 10/766,217, 10/766,786, and 10/766,116, all incorporated by reference above.

Returning to the exemplary memory cell of FIG. 6, for drain side injection programming, the amount of charge transferred to the floating gate 621 in a programming process of a given duration will depend on the voltage difference induced between the floating gate 621 and the channel as well as the current flowing between the terminals Y and Z. Traditionally, the programming process was controlled by the duration of a programming while applying a data independent set of bias conditions on the terminals. This was extended in the preceding section by using a voltage difference between terminals Y and Z that was a function of the target data state while pulsing the control gate 611 of the cell at terminal X, and applying a sequences of stair cased pulses to the control gates each of which program pulses is followed by a verify operation. The current section introduces the complimentary approach of limiting the current flowing between terminals Y and Z based on the target data state.

In this current based approach, a current limiting device 603 is placed between terminal Z and ground. Starting from a cell in an initial state (either the post erasure state, which may or may not be the ground (commonly erased) state, or some other state or intermediate condition once the process is under way), a target data state is selected. The maximum level of current allowed to flow between terminals Y and Z is then set by element 603 to the level I=I(target state) as this current through transistor 645 is mirrored by transistor 643 that determines the current flow between terminals Y and Z. For example, the current limiting device 603 can be based on a current mirror. Terminal Y could then be biased to place a voltage (possibly data dependent, as above) across the cell as the control gate 611 is pulsed in order to transfer charge to floating gate 621. (Switches 621 and 661 and sense amp 653 serve the same function as the corresponding elements of FIGS. 4A and 4B.)

The preceding section describes using source side, data dependent, current limiting in a binary fashion to lock out those storage elements whose threshold values have reached the desired target values, and to continue programming those cells whose threshold values have not yet reached the desired targets using a constant programming current sink that achieves its constant current by raising the source voltage. As described there, the process varies the cells' source voltages on a cell-by-cell basis during programming. This results in the ability to program some cells while other cells are being locked out by raising their sources voltages to, for example, 2.5V. In many ways, the present discussion extends this work by taking advantage of this degree of control in a more analog fashion in a way that would allow those cells that are to be programmed to lower states to asymptotically approach lower threshold value targets (during the stair casing of the control gate voltage) as compared to those cells that are to be programmed to higher states, while all cells are being programmed with the same control gate pulse during any given program pulse.

For the exemplary storage unit of FIG. 6, a cell is found to have the following relation between its drain-source current IDS and threshold voltage $V_T$ of $\log(I_{DS}) = m \times V_T + b$. The slope m is a device characteristic that can be calculated from measured data and the intercept b is a function of the control gate pulse voltage. As the starting value of the control gate pulse voltage can be selected, the value of b can be chosen.

The process will be described for a particular device example in order to present a table for an implementation that would use source side current limiting through the use of constant current sinks connected to the source electrodes, with the value of current being a function of the state that each cell is to be programmed to. The example device will have the behavior $\log(I_{DS}) = m \times V_T + b$, where the slope m can be calculated from the measured data to be 0.775, and the intercept b happens to be −0.633 for a control gate program voltage stair case ending at 10V. As the starting value of the control gate pulse voltage is controllable, a value of 0.286 for b is selected to obtain the values in Table 1 for a state-to-state separation of 500 mV.

TABLE 1

Assuming a state-to-state separation of 500 mV

| State | VT | Coarse Current Sink Value (nA) | Fine Current Sink Value (Option 1) (nA) | Fine Current Sink Value (Option 2) (nA) |
|---|---|---|---|---|
| 7 | 3.5 | 1000.19 | 409.67 | 167.79 |
| 6 | 3.0 | 409.67 | 167.79 | 68.73 |
| 5 | 2.5 | 167.79 | 68.73 | 28.15 |
| 4 | 2.0 | 68.73 | 28.15 | 11.53 |
| 3 | 1.5 | 28.15 | 11.53 | 4.72 |
| 2 | 1.0 | 11.53 | 4.72 | 1.93 |
| 1 | 0.5 | 4.72 | 1.93 | 0.79 |

The first column is the data state and the second column the corresponding threshold value. This assumes starting from a "0" state corresponding to a threshold voltage of 0 volts. The third column corresponds to the exemplary values for the constant current sinks connected to the source electrodes (terminal Z in FIG. 6). The other columns are discussed below.

The exemplary embodiments use a different limit for each target state. More generally, the method can use a lesser number of limits, so that several different target states may share a limit. As a simple example, states 1-4 could share one limit and states 5-7 share another. Although this arrangement does not take maximum advantage of the invention, it simplifies the overhead. Also, the states which share a level can be regrouped as the process progresses.

Because the various approaches under consideration all aim to provide tight distributions of programmed threshold voltages, this can be used to produce programmed distributions that will be tighter than otherwise possible, allowing the same number of states to fit into a smaller threshold voltage window, so that the device may be operated at lower power, the programming time shortened and/or allow more states to be safely stored in the same size threshold voltage window. For comparison, state-to-state separations can be reduced to the same extent that programming distributions can be tightened, keeping the state-to-state margin the same for any two schemes that are compared. To this end, Table 2 depicts the range of necessary constant currents sink values to program seven states with a state-to-state separation of 400 mV.

TABLE 2

Assuming a state-to-state separation of 400 mV

| State | VT | Coarse Current Sink Value (nA) | Fine Current Sink Value (Option 1) (nA) | Fine Current Sink Value (Option 2) (nA) |
|---|---|---|---|---|
| 7 | 2.8 | 1000.15 | 489.71 | 239.78 |
| 6 | 2.4 | 489.71 | 239.78 | 117.40 |
| 5 | 2.0 | 239.78 | 117.40 | 57.48 |
| 4 | 1.6 | 117.40 | 57.48 | 28.14 |
| 3 | 1.2 | 57.48 | 28.14 | 13.78 |
| 2 | 0.8 | 28.14 | 13.78 | 6.74 |
| 1 | 0.4 | 13.78 | 6.74 | 3.30 |

The columns of Table 2 are the same as those of Table 1, but with the values corresponding to the closer spacing. The additional two columns on the right of the Tables are for use in a coarse-fine programming method, such as those described in U.S. patent application Ser. Nos. 09/793,370, 10/766,217, 10/766,786, and 10/766,116, incorporated above. In both cases, the middle column would be used for the coarse programming phase and one of the two columns to the right would be used for the fine programming phase, where which one is chosen would depend on how much finer, relative to the coarse phase, the fine phase is designed to be.

While Tables 1 and 2 are based on a typical cell, the variation from typical will be absorbed by stair casing the control gate voltage, with for example a 200 mV step size, and achieving fine programming by dynamically switching to a current sinking value corresponding to N states below any targeted state value, as a particular cell finishes coarse programming and starts fine programming. Option 1 of fine programming corresponds to N=1, and Option 2 of fine programming corresponds to N=2. Referring to Table 1, and adopting Option 1 to program a cell to state 5, the current sink value is set to 240 nA during coarse programming, and switched to 117 nA for a current sink value in the fine programming phase. This lower programming current should reduce the size of the packets of charge injected into the floating gate during the first few fine-programming pulses. Although different sets of values could be used for each of the coarse and fine phases complexity is reduced by sharing values; for example, referring again to the coarse programming of state 5 for either table, this same value is shared by the fine programming of state 6 in Option 1 and of state 7 in Option 2.

Various issues associated with coarse to fine transition verifies that are discussed more fully in U.S. patent application Ser. Nos. 10/766,217, 10/766,786, and 10/766,116 all on Jan. 27, 2004 incorporated by reference above, remain applicable to the present scheme. For example, a "look ahead" delta of 150 mV is realized by applying 100 mV to the read source (near bit line) of the cell during coarse verify operations, and switching to a grounded read source in the fine verify phase. In this scheme the starting control gate voltage is a high value, e.g. 8V. The various source voltages that the constant current sinks apply to the source bit lines stop the lower states from over-programming. Continuing with the example of 200 mV per step, 16 pulses will typically be required to program every cell to its final threshold voltage target. Based on measurements, the natural distribution of blind programming of 1 sector produces a VT spread of 0.923V or a 1$\sigma$ value of 136 mV. The number of cells in an 8-state 2 giga-bit chip is 829,030,400 which corresponds to ±6.08$\sigma$=12.16$\sigma$. Therefore the spread in the natural distribution of cell VT's across an entire 2 Gbit chip will be 12.16× 136 mV=1654 mV, assuming a Normally distributed population of cells.

Nine coarse pulses with a step size of 200 mV will cover a 1.8V range. An additional set of five or less fine programming pulses should finish the job. In order to almost eliminate the chances of overshooting on the first pulse, the control gate pulses can start at a value corresponding to 6.08$\sigma$'s below the mean. So if the typical cell will be programmed to its target VT with a single 9.0V pulse, it will have to be backed off from 9.0V by 6.08$\sigma$=827 mV. The starting control gate voltage will be 8.2V. The final control gate voltage in very rare cases will be 8.2+14×0.2=11.0V. The typical sector will require 6.08$\sigma$+ 3.4$\sigma$=9.48$\sigma$=9.48×136 mV=1.29V worth of coarse pulse steps which translates into INT(1.29/0.2)+1=8 coarse pulses plus an additional 5 fine pulses for a total of 13 pulses per sector write.

The various aspects of the present invention can be implemented for NOR or other architectures, such as are described in the various references incorporated herein, where the programming rate depends upon the source-drain current level; further, they are generally applicable not to just Flash or EEPROM memories, but to any memory technology where programming rate depends on current flow rate. In a NOR array the current limiter for an element 601 would be placed on bit line BL1 connected to the source terminal Z, with the bit line bias voltage supplied on bit line BL2; other technologies or architectures would use corresponding structures.

Figure 7:
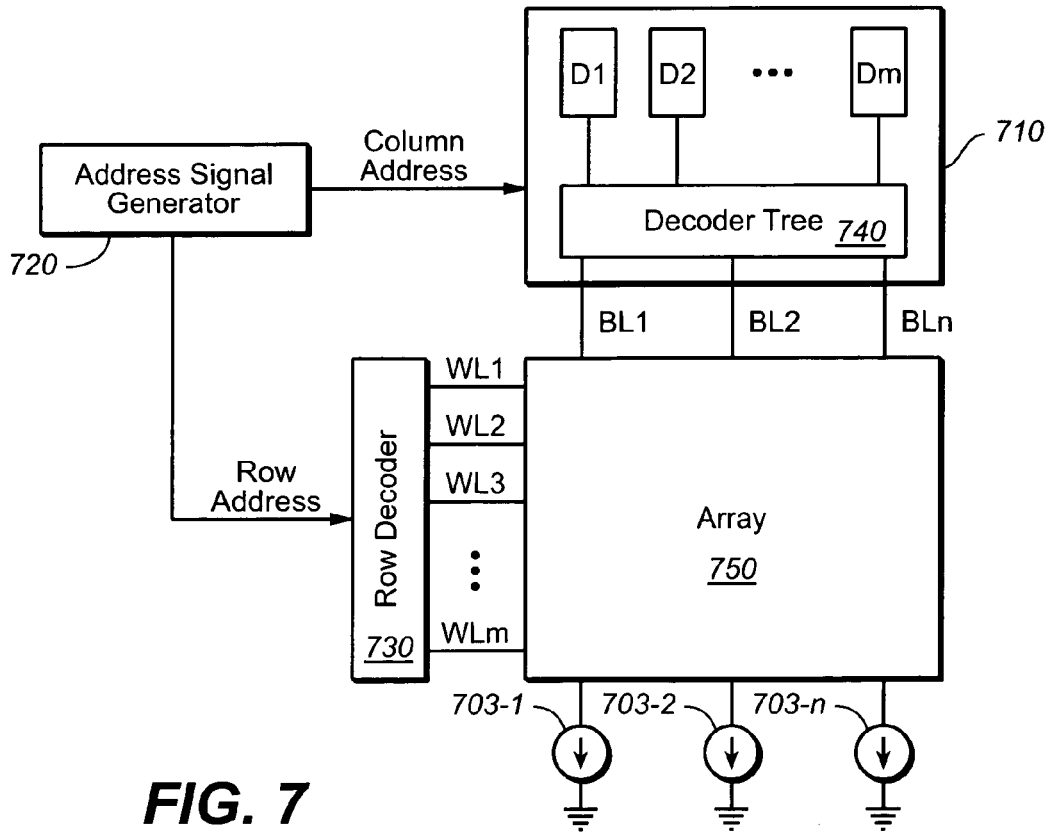
FIG. 7 is a schematic representation of a memory array and some of its peripheral circuitry to implement the aspect illustrated in FIG. 6.

FIG. 7 is a schematic representation of a memory including an array of storage elements along with some peripheral elements. Array 750 contains the storage elements, where a portion could be of the form shown in FIG. 2 or FIG. 3. The word lines WL1-WLM are connected to row decoder 730 and bit lines BL1-BLN are connected to column decoder 710. Both of decoders 710 and 730 are connected to address signal generator 720 through which the storage elements are selected for programming or other processes. The column decoder is shown to include a decoder tree 740, which actually selects the desired bit lines, and a series of bit line drivers D1-DM, each connectable to the bit lines through the decoder tree to set the appropriate bias level. According to a primary aspect of the present invention, during a programming operation, a bit line driver connected to a selected bit line will set a bias level dependent on the target data state to which a selected storage element is to be programmed. The various limiters are shown schematically at 703-1 to 703-N in FIG. 7. As noted, this is a schematic representation to illustrate basic elements related to the invention. Much of this circuitry is developed further in U.S. patent application Ser. Nos. 10/766, 217, 10/766,786, and 10/766,116, all incorporated by reference above. Although presented there in the context of a coarse-fine programming technique, much of it is applicable here.

In one embodiment, this scheme will require all 7 state verifies to be performed after each and every programming pulse, because the first programming pulse is just as likely to be the last required coarse pulse of a cell that is to be programmed to state 7 as it is to be the last required coarse programming pulse of a cell that is to be programmed to state 1. Also, the last programming pulse is just as likely to be the final fine programming pulse of a cell that is to be programmed to state 1 as it is to be the final fine programming pulse of a cell that is to be programmed to state 7. Hence, a smart verify method, such as that described in U.S. patent application Ser. No. 10/314,055, incorporated by reference above, will not be directly applicable to this scheme. Although this will result in a relatively longer time for the verify portion of the program-verify process, the ability to concurrently program all storage elements in more or less the same number of pulses regardless of their target state can result in a roughly 25% increase of raw performance according to simulations.

One issue with constant current sources operating at such low levels of current is the time it would take for the current sinks to move from a cutoff condition to a voltage on the source corresponding to the desired current level. There will be an inverse relationship between the current sink value and the time it takes to bring the source voltage down from a cut off condition to a value corresponding to the desired current sinking value. A bit line with a fairly typical value 2 pF capacitance will take 0.8 μs to drop down 0.4V at a current sinking value of 1000 nA; and if the current sinking value is 10 nA, then the settling time will be 80 μs, which is longer than desirable.

To minimize this effect, the current based approach can be combined with the previously described voltage based approach. In this alternative approach, applying a state dependent source bias voltage during programming provides the current limiting required by different states. Based on measurements on sample elements, every additional 100 mV on the source results in a 750 mV reduction in the threshold voltage of the memory cell for the same programming pulse. Hence, a state-to-state separation of 500 mV requires 67 mV difference of source voltages between 2 neighbor states. 6×67=400 mV of difference is then required for source voltages for programming state 1 vs. state 7. In other words, a cell that is to be programmed to state 1 will have a programming source voltage that is 400 mV higher than the source of a cell that is to be programmed to state 7. The challenge here is to provide stable and accurate voltage sources that function properly under the conduction current load conditions associated with the sources of the cells that are being simultaneously programmed. It is important to note that the voltage sources for driving the sources of the cells that are being programmed to lower states require much less current in comparison to the voltage sources that drive the sources of cells that are being programmed to higher states. Therefore, the various source supplies need not be designed with the same strength.

Assuming the extreme condition that every cell in all the sectors that are being programmed concurrently are to be programmed to state 7, then the voltage source for programming all these 1472×8/2=5888 cells will have to be designed to support 5.9 mA of current assuming that the average current per cell is 1000 nA for cells to be programmed to state 7. If this is not practical, then a higher source bias, or a lower word line bias can be applied to these cells to limit the typical cell's current to, for example, 100 nA. This would entail higher source biases for every state, or a lower select gate voltage. The reduction in programming rate can be compensated for with higher programming control gate voltages as long as the maximum possible programming control gate voltage is not frequently reached at the end of the program/verify stair-casing of control gate voltages.

Although the various aspects of the present invention have been described with respect to specific exemplary embodiments, it will be understood that the invention is entitled to protection within the full scope of the appended claims.

What is claimed is:

1. In a non-volatile memory including an array of multi-state storage elements connected in a plurality of columns along bit lines and along one or more rows each connected to a corresponding word line, a method of concurrently programming a plurality of the storage elements connected along a common word line from an initial condition to one of a plurality of data states, comprising:
   providing for each of said plurality of the storage elements connected along the common word line a corresponding target state from said plurality of data states; and
   biasing said plurality of the storage elements, wherein the biasing includes:
      independently limiting the current on each of the respective bit lines to which said plurality of the storage elements are connected to not exceed a value selected from a plurality of values dependent upon the corresponding target state of the respective storage element; and
      subsequently applying a programming waveform to the common word line while the respective bit lines are concurrently so limited to two or more different ones of said values.

2. The method of claim 1, wherein said current on each of the respective bit lines is the source-drain current of the corresponding storage elements and the common word line supplies the programming waveform to the control gates of each of said plurality of the storage elements.

3. The method of claim 2, wherein said programming waveform is a series of pulses.

4. The method of claim 1, wherein the storage elements are charge-storing devices.

5. The method of claim 4, wherein the storage elements are floating gate transistors.

6. A non-volatile memory comprising:
   an array of multi-state storage elements connected in one or more columns along bit lines and along one or more rows each connected to a corresponding word line;
   programming circuitry connectable to the bit lines and the word lines to apply a set of voltages to perform a program operation to concurrently program a plurality of the storage elements connected along a common word line from an initial condition to a corresponding target state from one of a plurality of data states, set of voltage including a programming waveform applied to the common word line; and
   current limiting circuitry connectable to said bit lines to individually limit the current through said plurality of the storage elements to not exceed a value selected from a plurality of values dependent upon the corresponding target state of the respective storage elements and that are determined prior to applying the programming waveform to the common word line while the respective bit lines are concurrently so limited to two or more different ones of said value.

7. The non-volatile memory of claim 6, wherein said set of voltages includes applying a programming waveform to common word line.

8. The non-volatile memory of claim 7, wherein said programming waveform is a series of pulses.

9. The non-volatile memory of claim 6, wherein the storage elements are charge-storing devices.

10. The non-volatile memory of claim 9, wherein the storage elements are floating gate transistors.

* * * * *

UNITED STATES PATENT AND TRADEMARK OFFICE
CERTIFICATE OF CORRECTION

PATENT NO. : 7,630,237 B2
APPLICATION NO. : 11/196547
DATED : December 8, 2009
INVENTOR(S) : Mokhlesi et al.

It is certified that error appears in the above-identified patent and that said Letters Patent is hereby corrected as shown below:

Column 22, line 44, please delete "set of voltage" and insert -- the set of voltages --.

Column 22, line 48, please delete "individually" and insert -- independently --.

Signed and Sealed this

Ninth Day of February, 2010

David J. Kappos
*Director of the United States Patent and Trademark Office*